(12) United States Patent
Tichenor et al.

(10) Patent No.: US 7,081,992 B2
(45) Date of Patent: Jul. 25, 2006

(54) CONDENSER OPTIC WITH SACRIFICIAL REFLECTIVE SURFACE

(75) Inventors: Daniel A. Tichenor, Castro Valley, CA (US); Glenn D. Kubiak, Livermore, CA (US); Sang Hun Lee, Sunnyvale, CA (US)

(73) Assignee: EUV LLC, Santa Clara, CA (US)

( * ) Notice: Subject to any disclaimer, the term of this patent is extended or adjusted under 35 U.S.C. 154(b) by 160 days.

(21) Appl. No.: 10/760,118

(22) Filed: Jan. 16, 2004

(65) Prior Publication Data

US 2005/0157383 A1    Jul. 21, 2005

(51) Int. Cl.
*F21V 9/04* (2006.01)
*F21V 9/06* (2006.01)
*G02B 5/08* (2006.01)
*G02B 5/20* (2006.01)

(52) U.S. Cl. ...................................... 359/359

(58) Field of Classification Search ................ 359/359, 359/360, 351, 350, 582, 584, 585, 588
See application file for complete search history.

(56) References Cited

U.S. PATENT DOCUMENTS

| | | | | |
|---|---|---|---|---|
| 4,870,648 A | 9/1989 | Ceglio | ............................ | 372/5 |
| 5,153,425 A | 10/1992 | Meinzer | ...................... | 250/216 |
| 5,291,341 A | 3/1994 | Templeton | .................. | 359/884 |
| 5,361,292 A | 11/1994 | Sweatt | ......................... | 378/34 |
| 5,499,282 A | 3/1996 | Silfvast | ...................... | 378/119 |
| 5,577,092 A | 11/1996 | Kubiak | ........................ | 378/119 |
| 5,737,137 A | 4/1998 | Cohen | ......................... | 359/859 |
| 5,796,523 A | 8/1998 | Hall | ............................ | 359/629 |
| 5,958,605 A | 9/1999 | Montcalm | .................... | 428/627 |
| 6,031,241 A | 2/2000 | Silfvast | .................. | 250/504 R |
| 6,031,598 A | 2/2000 | Tichenor | ..................... | 355/67 |
| 6,033,079 A | 3/2000 | Hudyma | ..................... | 359/857 |
| 6,118,577 A | 9/2000 | Sweatt | ....................... | 359/351 |
| 6,147,818 A | 11/2000 | Hale | .......................... | 359/819 |
| 6,160,867 A | 12/2000 | Murakami | ................... | 378/84 |
| 6,210,865 B1 | 4/2001 | Sweatt | ........................ | 430/311 |
| 6,285,737 B1 | 9/2001 | Sweatt | ......................... | 378/85 |
| 6,295,164 B1 | 9/2001 | Murakami | ................... | 359/584 |
| 6,356,618 B1 | 3/2002 | Fornaciari | ................... | 378/119 |
| 6,377,655 B1 | 4/2002 | Murakami | ................... | 378/84 |
| 6,469,827 B1 | 10/2002 | Sweatt | ....................... | 359/351 |
| 6,833,223 B1 * | 12/2004 | Shiraishi | ........................ | 430/5 |
| 2003/0006214 A1 | 1/2003 | Steams et al. | | |

FOREIGN PATENT DOCUMENTS

| | | |
|---|---|---|
| EP | 1 152 435 A | 11/2001 |
| JP | 2002 267799 A | 9/2002 |

OTHER PUBLICATIONS

Patent Abstracts of Japan, Jan. 14, 2003, vol. 2003 No. 1.

* cited by examiner

*Primary Examiner*—Alessandro Amari
(74) *Attorney, Agent, or Firm*—Cascio Schmoyer & Zervas (57) ABSTRACT

Employing collector optics that have a sacrificial reflective surface can significantly prolong the useful life of the collector optics and the overall performance of the condenser in which the collector optics are incorporated. The collector optics are normally subject to erosion by debris from laser plasma source of radiation. The presence of an upper sacrificial reflective surface over the underlying reflective surface effectively increases the life of the optics while relaxing the constraints on the radiation source. Spatial and temporally varying reflectivity that results from the use of the sacrificial reflective surface can be accommodated by proper condenser design.

19 Claims, 7 Drawing Sheets

CONDENSER OPTIC WITH SACRIFICIAL REFLECTIVE SURFACE

This invention was made with Government support under Contract No. DE-AC04-94AL85000 awarded by the U.S. Department of Energy to Sandia Corporation. The Government has certain rights to the invention.

FIELD OF THE INVENTION

EUV lithography (EUVL) is an emerging technology in the microelectronics industry. It is one of the leading candidates for the fabrication of devices with feature sizes of 45 nm and smaller. This invention relates to techniques for extending the lifetime of the plasma-facing condenser surface of EUVL devices.

BACKGROUND OF THE INVENTION

In general, lithography refers to processes for pattern transfer between various media. A lithographic coating is generally a radiation-sensitized coating suitable for receiving a cast image of the subject pattern. Once the image is cast, it is indelibly formed on the coating. The recorded image may be either a negative or a positive of the subject pattern. Typically, a "transparency" of the subject pattern is made having areas which are selectively transparent or opaque to the impinging radiation. Exposure of the coating through the transparency placed in close longitudinal proximity to the coating causes the exposed area of the coating to become selectively crosslinked and consequently either more or less soluble (depending on the coating) in a particular solvent developer. The more soluble, i.e., uncrosslinked, areas are removed in the developing process to leave the pattern image in the coating as less soluble crosslinked polymer.

Projection lithography is a powerful and essential tool for microelectronics processing and has supplanted proximity printing. "Long" or "soft" x-rays (a.k.a. Extreme UV)(wavelength range of 10 to 20 nm) are now at the forefront of research in efforts to achieve smaller transferred feature sizes. With projection photolithography, a reticle (or mask) is imaged through a reduction-projection (demagnifying) lens onto a wafer. Reticles for EUV projection lithography typically comprise a glass substrate coated with an EUV absorbing material covering portions of the reflective surface. In operation, EUV radiation from the illumination system (condenser) is projected toward the surface of the reticle and radiation is reflected from those areas of the reticle reflective surface which are exposed, i.e., not covered by the EUV absorbing material. The reflected radiation is re-imaged to the wafer using a reflective optical system and the pattern from the reticle is effectively transcribed to the wafer.

A source of EUV radiation is the laser-produced plasma EUV source, which depends upon a high power, pulsed laser (e.g., a yttrium aluminum garnet ("YAG") laser, or an excimer laser, delivering 2000 to 10,000 watts of power to a 50 μm to 250 μm spot, thereby heating a source material to, for example 250,000 to 500,000° C., to emit EUV radiation from the resulting plasma. Plasma sources are compact, and maybe dedicated to a single lithography tool that malfunction of one source or tool does not close down the entire plant. A stepper employing a laser-produced plasma source is relatively inexpensive and could be housed in existing facilities. It is expected that EUV sources suitable for photolithography that provide bright, incoherent EUV and that employ physics quite different from that of the laser-produced plasma source will be developed. One such source under development is the EUV discharge source.

Figure 7:
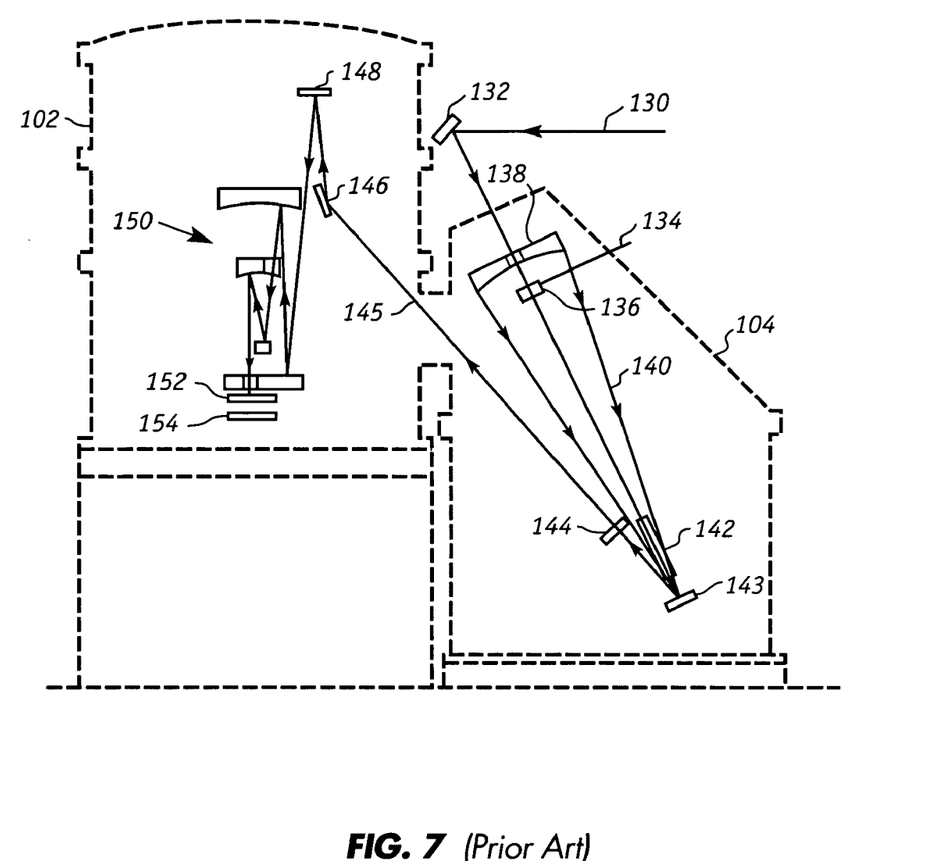
FIG. 7 shows a prior art photolithography device.

EUV lithography machines for producing integrated circuit components are described, for example, in U.S. Pat. No. 6,031,598 to Tichenor et al. Referring to FIG. 7, the EUV lithography machine comprises a main vacuum or projection chamber 102 and a source vacuum chamber 104. Source chamber 104 is connected to main chamber 102 through an airlock valve (not shown) which permits either chamber to be accessed without venting or contaminating the environment of the other chamber. Typically, a laser beam 130 is directed by turning mirror 132 into the source chamber 104. A high density gas or liquid stream, such as xenon, is injected into the plasma generator 136 through gas supply 134 and the interaction of the laser beam 130, and gas supply 134 creates a plasma giving off the illumination used in EUV lithography. The EUV radiation is collected by segmented collector 138, that collects about 30% of the available EUV light, and the radiation 140 is directed toward the pupil optics 142. The pupil optics consists of long narrow mirrors arranged to focus the rays from the collector at grazing angels onto an imaging mirror 143 that redirects the illumination beam through filter/window 144. Filter 144 passes only the desired EUV wavelengths and excludes scattered laser beam light in chamber 104. The illumination beam 145 is then reflected from the relay optics 146, another grazing angel mirror, and then illuminates the pattern on the reticle 148. Mirrors 138, 142, 143, and 146 together comprise the complete illumination system or condenser. The reflected pattern from the reticle 148 then passes through the projection optics 150 which reduces the image size to that desired for printing on the wafer. After exiting the projection optics 150, the beam passes through vacuum window 152. The beam then prints its pattern on wafer 154.

Production of debris and high energy ions by the plasma source is one of the most significant impediments to the successful development of photolithography. In particular, species tend to erode the optics used to collect the EUV light which severely degrades their EUV reflectance. Ultimately, the erosion will reduce the optics' efficiency to a point where they must be replaced frequently. The art is in search of techniques that address this problem.

SUMMARY OF THE INVENTION

The present invention is based in part on the recognition that employing collector optics that have a sacrificial reflective surface can significantly enhance the useful life of the collector optics and subsequently improve the overall performance of the condenser in which the collector optics are incorporated.

In one embodiment, the invention is directed to a condenser system for use with a camera to collect and image radiation to a mask the includes:

a source of radiation; and at least one collector mirror facing the source of radiation wherein the at least one collector mirror comprises a substrate, an underlying reflective surface, and an upper sacrificial reflective surface.

In another embodiment, the invention is directed to a condenser system having a set of mirrors for collecting extreme ultra-violet (EUV) radiation from a radiation source that forms a source image correcting mirrors which are capable of translating or rotating, or both, one or more beams from said set of mirrors and are capable of modifying the convergence of the one or more beams or the size of the source image, or both, and wherein the system includes at least one collector mirror facing a source of EUV radiation wherein the at least one collector mirror comprises a substrate, an underlying reflective surface, and an upper sacrificial reflective surface.

In a further embodiment, the invention is directed to a method of preparing a collector mirror of a condenser system for collecting radiation of a selected wavelength from a source of radiation that includes the steps of:
(a) depositing a first multilayer film on a substrate such that the film achieves a desired reflectance with respect to a first radiation light having a first wavelength; and
(b) depositing a second multilayer film on the first multilayer film, wherein the second multiplayer film also reflects the first radiation light.

DESCRIPTION OF PREFERRED EMBODIMENTS

The present invention is directed to condenser systems that employ collector mirrors with sacrificial reflective surfaces. While the invention will be described with respect to a particular condenser, it is understood that the collector mirrors with the sacrificial reflective surfaces can be used with any condenser particularly those that are used in photolithography. Condenser illumination systems include, for example, Kohler and critical illumination condenser systems. Condensers can be coupled to a variety of radiation sources including, for example, line-shaped plasma source or an arc-shaped discharge source. Condenser are described, for example, in U.S. Pat. No. 5,361,292 to Sweatt, U.S. Pat. No. 5,737,137 to Cohen et al., U.S. Pat. No. 6,033,079 to Hudyma, and U.S. Pat. Nos. 6,118,577, 6,210,865, 6,285,737, and 6,469,827 all to Sweatt et al., which are incorporated herein by reference.

By "sacrificial reflective surface" formed on a collection mirror is meant a multilayer reflective stack that is fabricated on top of an underlying reflective surface of the collection mirror. In the case of a collection mirror for EUV radiation, the collection mirror itself comprises a stack of alternating layers of two or more materials that are deposited on a substrate. Thus, the "sacrificial reflective surface" can be viewed as a second stack, which also comprises alternating layers of two or more materials, that is fabricated on the first stack of the collection mirror. The materials that form the second stack can be different from those that form the first stack, however, for simplicity in design and fabrication, the materials and their thicknesses that form the second stack are preferably the same.

A critical feature of the invention is that the upper sacrificial reflective surface is not intended to be a permanent, protective overcoat shielding the underlying reflective surface of the collection mirror from oxidation or degradation due to exposure to the radiation source. These prior art protective overcoats are also referred to as "passivating overcoats" which are described, for instance, in U.S. Pat. No. 5,958,605 to Montcalm et al., which is incorporated herein. The inventive sacrificial reflective surface does not require such passiviating or capping coatings, rather, with the present invention the sacrificial reflective surface is intended to gradually degrade in much the same fashion as the underlying reflective surface during normal operations. Of course, the sacrificial reflective surface will erode first before the underlying reflective surface is exposed. In the case where the bilayers of the sacrificial reflective surface are made of the same materials as that of the underlying reflective surface, the individual bilayers of the sacrificial multilayer will also have substantially the same thickness and periodicity as bilayers of the underlying reflective surface.

Figures 1, 2A:
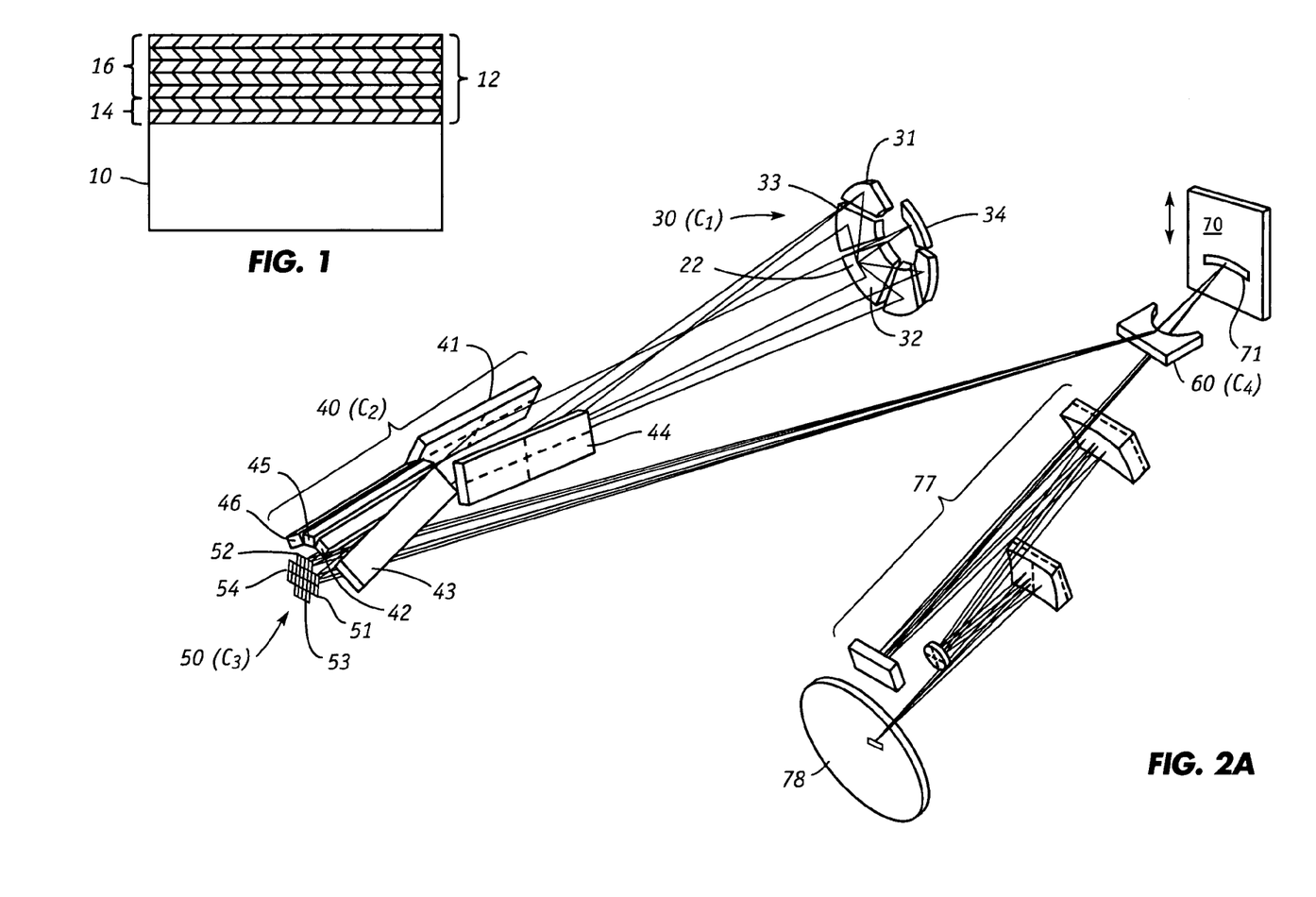
FIG. 1 shows the a collection mirror formed of a bilayer stack.
FIG. 2A is a perspective view of an EUV photolithography system showing the beams going through its set of correcting mirrors and showing the interaction of the beam with the camera.

FIG. 1 is a schematic of a collector mirror that includes the inventive sacrificial reflective surface or stack. The structure of the collector mirror includes a multilayer stack 12 that is deposited on the upper surface of substrate 10. The substrate 10 serves as a support and can be made of any suitable material including, for example, silicon or glass. The stack 12 comprises an (i) underlying reflective surface 14 that is fabricated directly on the substrate 10 and (ii) an upper sacrificial reflective surface 16 that is fabricated on the surface 14. (As is apparent, FIG. 1 is illustrative since the number of layers in the stack 12 is actually much greater.)

The multilayer reflection stack 12 is designed to reflect at the wavelength of interest and is formed of alternating layers of two or more materials that can be deposited by conventional thin-film and multilayer techniques. Preferred materials include, for example, molybdenum (Mo), silicon (Si), tungsten (W), carbon (C), beryllium (Be), ruthenium (Ru), $B_4C$, $Mo_2C$, titanium (Ti), and vanadium (V). Preferred stacks are formed from alternating layers of two materials that are selected from the following list of seven pairs: Mo—Si, W—C, Mo—Be, Ru—$B_4C$, $Mo_2C$—Si, Ti—C, and V—C. Alternating layers of Mo and Si (Mo/Si) are particularly preferred for EUV applications, e.g., radiation with a wavelength on the order of 10 nm. As further described herein, the reflectance of radiation from a multilayer reflective stack is proportional to the number of bilayers that form the stack but the reflectance does reach a plateau once the certain number of bilayers is reached. A larger number of layers will provide higher reflectivity at the cost of lower angular and temporal bandwidth. The number of bilayer will depend on the materials used and will typically range from about 10 to 200 and preferably from about 20 to 80. Moreover, the bilayers will typically have a bilayer periodicity of about 2 nm to 100 nm and preferably from about 5 nm to 30 nm. By "periodicity" is meant the thickness of one bilayer.

In fabricating a collection mirror that incorporates the sacrificial reflective surface for EUV lithography, it is first necessary to design and deposit the underlying reflective surface or stack onto a substrate. A preferred underlying reflective surface comprises alternating bilayers described above. For EUV applications, the underlying reflective surface will typically comprise from 20 to 80 bilayers which produces a stack that should reflect approximately 20% to 80% and preferably at least 30% EUV and has a normal incidence reflectivity of EUV of at least about 30%. A preferred stack comprises 40 to 60 bilayers of Mo and Si which reflects typically 60% to 70% EUV. For EUV lithography, the expected maximum EUV reflectance from plasma-facing collection mirrors will typically be within these ranges. The EUV reflectance of the stack will not improve significantly beyond this even if more bilayers are added.

Next, the a sacrificial reflective stack comprising Mo and Si bilayers are formed over the underlying reflective surface. For EUV applications, the sacrificial reflective surface will typically comprise from 40 to 400 and preferably from 60 to 200 number of bilayers of Mo and Si. In actual production, there is no disruption between the completion of the underlying reflective surface and initiation of the sacrificial reflective surface. In effect, the sacrificial reflective surface can be construed as the outer portion of bilayer stack that is not necessary for the mirror to attain the desired or maximum EUV reflectance. While the deposition of the sacrificial reflective surface or stack over the underlying reflective surface will not enhance the reflectance of the collection mirror, the sacrificial reflective surface will prolong the useful life of the collection mirror. In the preferred embodiment, the thickness of the sacrificial reflective stack is at least 2 times the thickness of the underlying reflective surface.

For EUV lithography applications, the EUV reflectance of a collection mirror as a function of the number of bilayers deposited on the mirror can be simulated, however, as a practical matter, theoretically perfect reflectivities are never achieved. In practice the "real reflectivities" of the mirror are measured during actual production and the total number of bilayers, designated as "x," needed to achieve the maximum reflectance is determined, which corresponds to the underlying reflective surface. With the present invention, the collection mirrors are fabricated by first depositing x number of bilayers on a substrate and then depositing an additional number of bilayers, designated as "y," as the sacrificial reflective surface. Y can be represented as fractions or multiple of x. In preferred embodiments, y is equal to at least twice x and preferably equal to three or four times x.

The durability of the inventive collection mirror will be proportional to the thickness the sacrificial reflective surface or stack. As is apparent, the physical characteristics of the materials used to form the multilayers of the sacrificial reflective surface will influence overall durability. From a practical standpoint, the number of multilayers that can be deposited will be limited by the stress that is created within the stack; the level of stress increases with the number of bilayers. At some point the stresses will either deform the optic, until it is out of specification, or more likely, cause the multilayer to fail and peel off of the substrate. Low stress multilayers are therefore preferred. The roughening of the surface with increased number of multilayers may also limit the number of bilayers that can be deposited on the stack.

Collection mirrors employing the sacrificial reflective surface can be incorporated in suitable EUV lithography systems such as the one shown in FIG. 2A. The radiation is collected from the source 22 by collection mirror segments 30 (referred to collectively as the "$C_1$" mirrors) which create arc images that are in turn are rotated by roof mirror pairs illustrated collectively as mirrors 40 and 50 (referred herein as the "$C_2$" and "$C_3$" mirrors, respectively). (As further described herein, the mirror segments 30 have the sacrificial multilayers.) Beams of radiation reflected from mirrors 50 are reflected by a toric mirror 60 (or $C_4$ mirror) to deliver six overlapped ringfield segments onto reflective mask 70. At least two segments of the parent mirror 30 are employed. Typically, the parent mirror is partitioned into 2 to 12 segments, preferably into 5 to 8 segments, and most preferably into 6 segments as shown. As an example, mirror 31 creates an arc image and roof mirror pair 41 and 51 rotates the arc image to fit the slit image and translate it to the proper position. Similar arc images are created and processed by mirror combinations 32, 42, and 52, and so on. Mirrors 41, 42, and 43 are parts of different and unique channels; and the group of mirrors 44, 45, and 46 is a mirror image of the group of mirrors 41, 42, and 43, respectively.

The distance from the $C_3$ mirrors defining the condenser's pupil to the $C_4$ mirror should be 3 to 10 times as long as the distance from the $C_4$ mirror to mask 70. An illustrative arc 71 is shown on mask 70.

The EUV lithography system further includes a ringfield camera 77 having a set of mirrors which images the mask using the radiation onto wafer 78. As is apparent, the $C_4$ mirror follows the real entrance pupil.

Each of the six pairs of $C_2$ and $C_3$ mirrors act as a roof-mirror pair that rotate and translate the 6 channels so that they overlap. Specifically, the $C_2$ and $C_3$ mirror pairs rotate the arcuate images produced by the $C_1$ mirrors so that they can be superimposed at the mask plane. The $C_2$ mirrors are preferably flat and are used at grazing incidence, which is preferably 82 degrees angle of incidence for the chief ray. The chief ray angle of incidence is preferably constrained to have the same angle of incidence at each $C_2$ mirror so that the reflectivities will be the same. Further, the $C_1$ angles are preferably tilted about the source to allow the angles of incidence to be the same at $C_1$. The $C_3$ mirrors typically have weak convex spherical surfaces which relay the $C_1$ arcuate images onto the mask. The $C_3$ mirrors are located at the system pupil (i.e., where the azimuthal beam cross-section is a minimum) to facilitate packaging and are tilted to overlay the arcuate images from the six channels. The $C_3$ mirrors are preferably positioned as close together as possible (approximately 3 mm separates the clear apertures) to maximize the amount of EUV that can be directed into the camera.

Figure 2B:
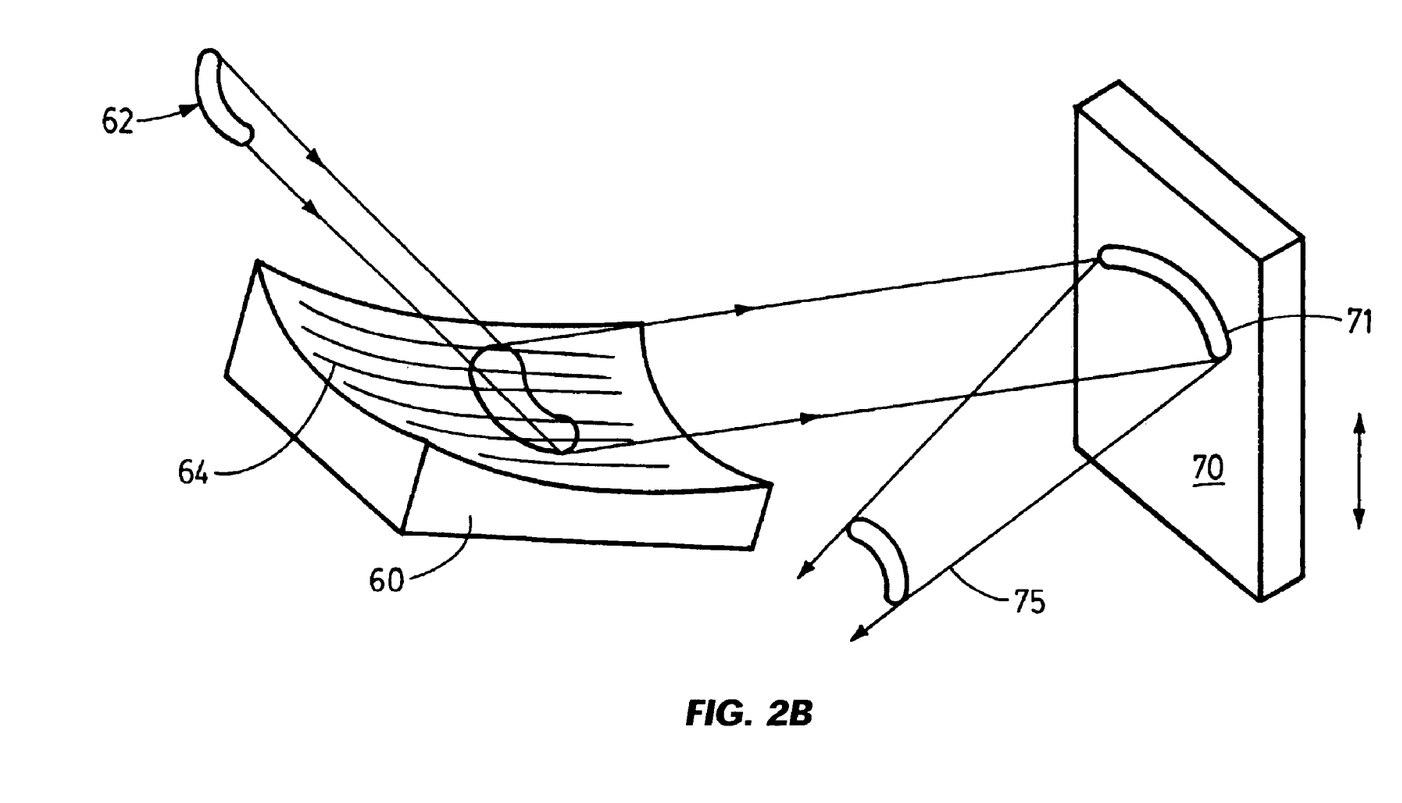
FIGS. 2B and 2C illustrate a steeply tilted biconvex mirror.
Figure 2C:
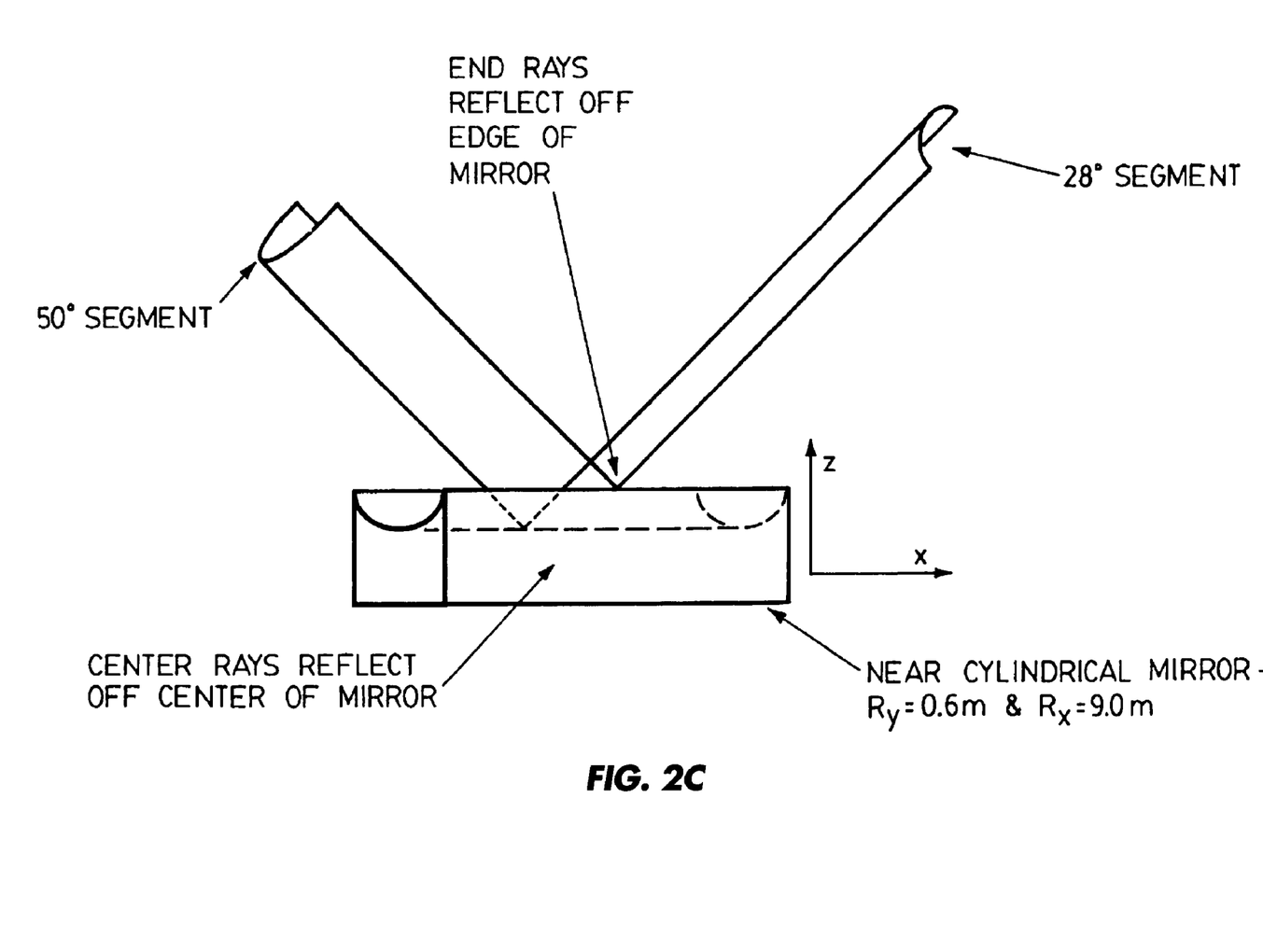

FIG. 2C depicts the $C_4$ field mirror 60 which is toroidally (or elliptically) shaped. As shown, a beam cross section 62 from the condenser is reflected from the surface of the mirror 60 to form a curved slit illumination 71 on moving mask 70 (FIG. 1A). Beam 75 is propagated from the mask into the camera. The toroid images the real pupil containing the $C_3$ mirrors into the entrance pupil of the camera. The focal length of mirror $C_4$ can be determined from the lens maker's equation. The radii of curvature $R_x$ and $R_y$ are functions of the focal length and the angle of incidence θ, as determined by Coddington's equation. The tilt angle also tends to distort the cross-section of an incident beam, with the distortion increasing with angle of incidence. The source of this distortion is shown in FIG. 2B that illustrates an embodiment of the $C_4$ biconcave mirror where $R_y$ is 0.6 m and $R_x$ is 9.0 m. As is apparent, remapping occurs when the middle of the 50 degrees segment is reflected off the bottom of the nearly cylindrical, steeply tilted concave mirror while the ends reflect off the edges of the mirror which are higher.

Figure 3A:
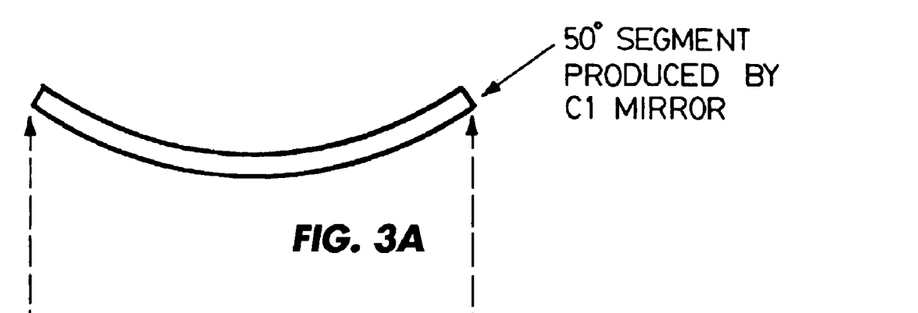
FIGS. 3A and 3B illustrate a beam segment before and after reshaping.
Figure 3B:
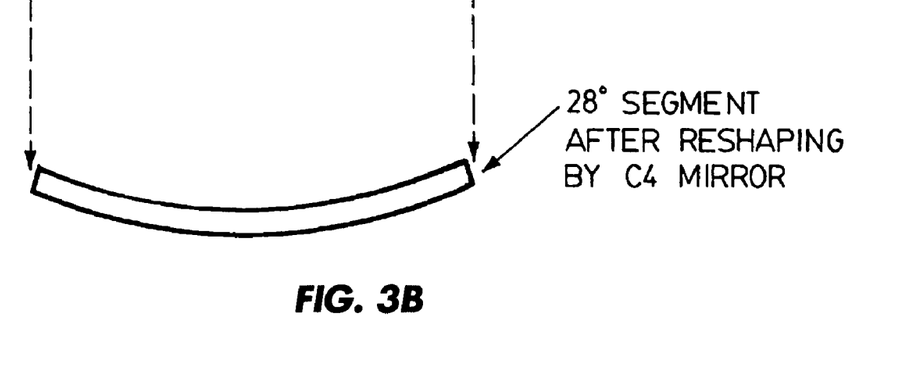

FIGS. 3A and 3B shows a beam segment before and after reshaping. Note that the ends of the 50 degrees segment curl far more than those of the 28 degrees segment.

Condensers of the present invention are particularly suited for use in projection lithography for fabricating integrated devices that comprise at least one element having a dimension of $\leqq 0.25$ μm and preferably $\leqq 0.18$ μm. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

Figure 4:
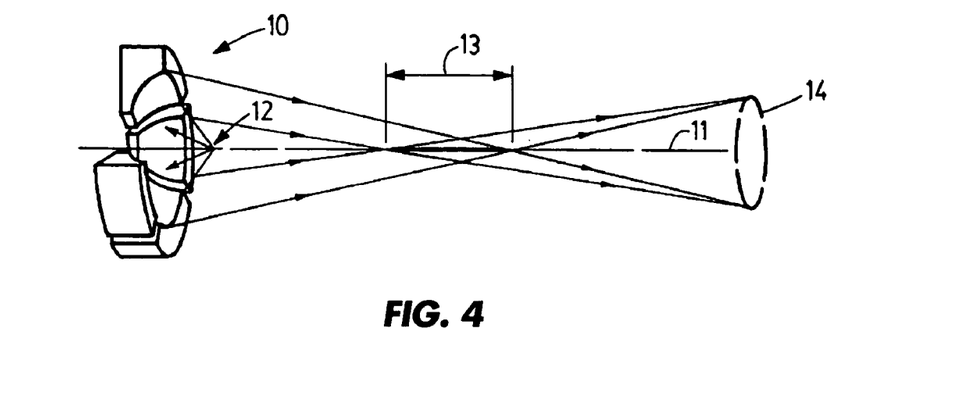
FIG. 4 is a side-view of the condenser system without correcting mirrors, showing the reimaging of the point source into a ringfield with the images crossing over the center line of the system.

As shown in FIG. 4, the illuminator or collecting mirrors are composed of six off-axis segments of an aspheric mirror, each 50 degrees wide, producing six beams which each cross over the system axis or centerline 11 as defined by the source and the center of the parent mirror. The parent aspheric mirror 10 images the "point" source 12 into a ring image 14. Therefore, its cross-section in the r–z plane is elliptical with one of the foci at the plasma source and the other at the ringfield radius. Each of the 50 degree mirror segments images the source into a 50 degree segment of the ring image.

Figure 5:
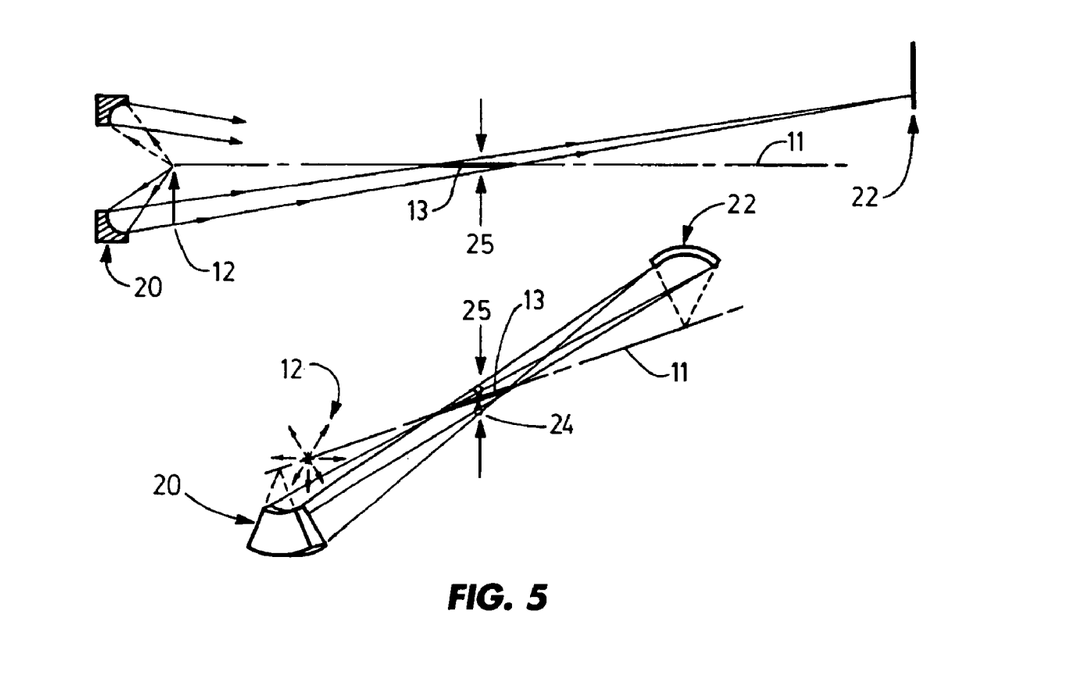
FIG. 5 is another side-view showing the geometries of the mirrors and the beams in more detail for this embodiment.

FIG. 5 shows both a meridian cross-sectional view and an isometric view of the beam from one segment 20 of the aspheric mirror, with the isometric view rotated relative to the side view about a line 25 passing through the area of the beam having a smallest beam cross section. It shows the shape of the collector mirror 20, the arc image 22, and the bow-tie-shaped minimum beam cross-section 24, which is located at the center of the axial line focus. This design gives uniform illumination along the length of the arc 22.

The lithography system preferably employs a small, compact source of radiation which generates a continuous spectrum of radiation including, for example, EUV, ultraviolet rays, and visible light. An example of such a source is a laser-generated plasma. "Small" implies a radiating volume with dimensions in the three principle directions smaller than about 0.2 mm. "Compact" implies that the three dimensions are roughly the same, differing from one-another by less than a factor of two. These lengths are defined as the full width between the half-maximum intensity points. For EUV lithography, the illumination radiation preferably has a wavelength from about 9 nm to 18 nm and preferably about 13.4 nm.

Suitable sources of radiation are the laser plasma source (LPS) which is described, for example, in U.S. Pat. No. 5,577,092 to Kubiak et al. and capillary discharge sources and pulsed capillary discharge sources described in U.S. Pat. Nos. 5,499,282 and 6,031,241 both to Silfvast. Another source is an electric capillary discharge described in U.S. Pat. No. 6,356,618 to Fornaciari et al.

As is apparent, the erosion rate of the collection $C_1$ mirrors will depend, in significant part, in the design of the radiation source 22 and its proximity to the collection mirrors as illustrated in FIG. 2A. In the case of a laser-generated plasma source, it has been found that the erosion rate of the $C_1$ mirrors is significantly influenced by the laser-to-nozzle separation. The nozzle (or target) is the outlet of the gas supply. Typically, a higher EUV output is realized with decreasing laser-to-nozzle separation, however, the concomitant effect is an increase in the erosion rates on the $C_1$ mirrors. Estimates show that $C_1$ mirrors designed with an underlying reflective surface comprising 40 bilayers of Mo/Si and a sacrificial reflective surface comprising 100 bilayers when used in the photolithography system described above will increase the $C_1$ lifetime by about 175 production days or more. This estimate is based on the production of 10 wafers per day, each having a 4×5 FEM of full-field dies, and each die requiring 80 seconds (0.5 mm/s scan speed) to expose. Proper design should enable the use of a smaller laser-to-target separation for the laser produced plasma, thereby increasing throughput with extended lifetime of $C_1$.

When employing $C_1$ mirrors with the sacrificial reflective surface as part of the condenser described above, in order to maximize performance of the photolithography system, the erosion pattern $C_1$ mirrors should also be taken into account. For example, since the erosion is likely to be non-uniform across each of the six $C_1$ mirrors, the reflectance will be spatially varying. In the above described photolithography system, for example, radial reflectance variations on $C_1$ do not appear in the reticle illumination, which is an image of the source in the scan direction. In the non-scan direction a shadow of the six $C_1$ mirrors, that comprise the $C_1$ element, is cast onto the reticle. Azimuthal variation in reflectivity will appear at the reticle. However, the six overlapping channels will likely reduce this variation. Therefore, the condenser is well suited for using collection mirrors with sacrificial reflective surface. The condenser design can compensate for this factor by assuring that the $C_1$ optic not imaged onto the reticle. In principle, condensers can be designed to accommodate spatial and temporal variations in the reflectance of the $C_1$ optic. Ideally, the $C_1$ optic is imaged into the pupil plane, where substantial intensity variations can be tolerated without measurable effect on imaging performance.

Figure 6A:
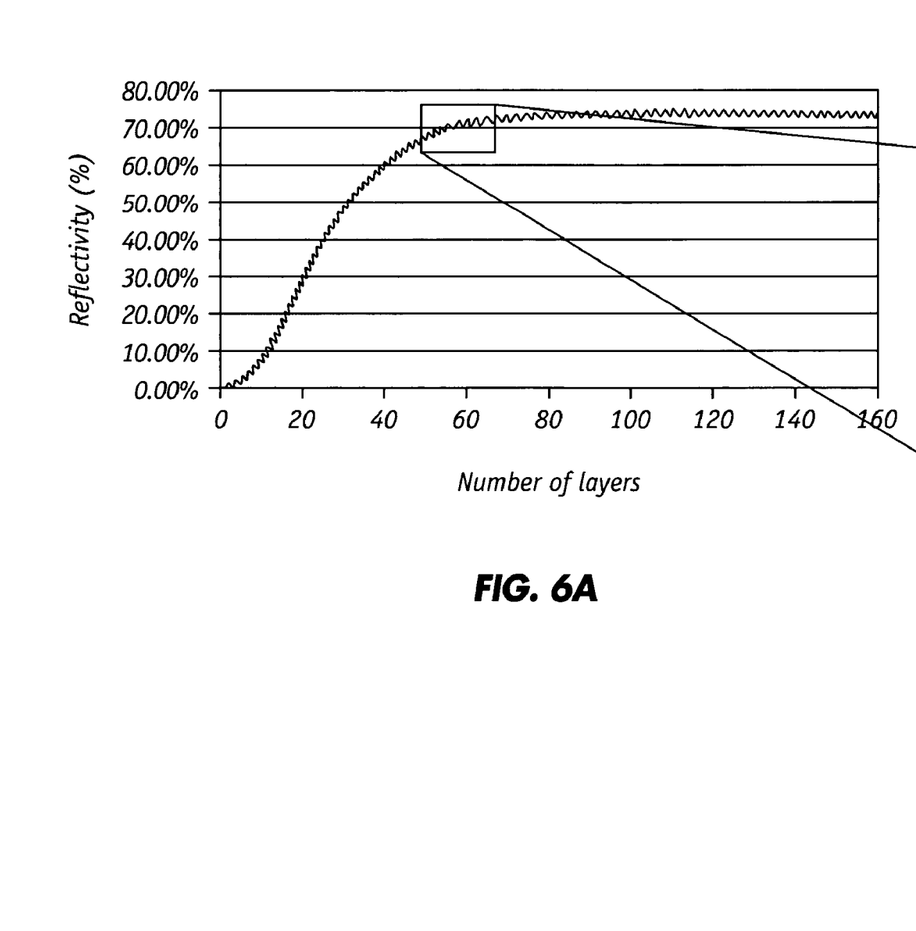
FIG. 6A is a graph of calculated reflectance for Mo/Si multilayer vs. erosion and 6B shows the local oscillations that occur due to alternating Mo and Si layers, respectively.
Figure 6B:
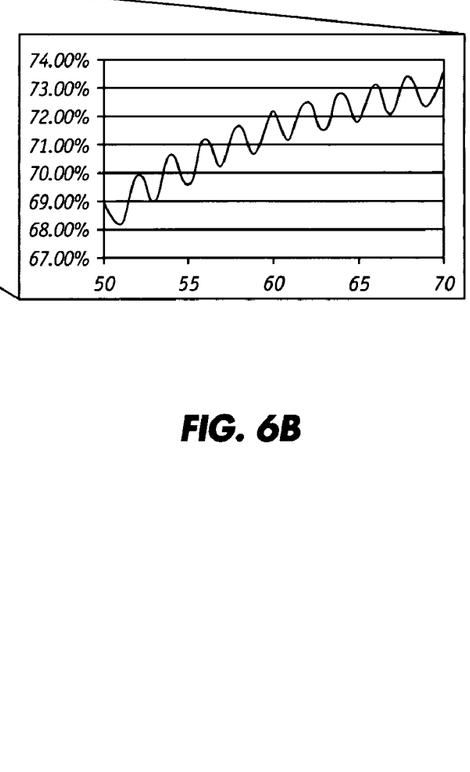

A related issue that needs to be considered is that magnitude of the reflectance variations of the sacrificial reflective surface as the surface erodes. The variations will depend, in part, on the particular materials used for the bilayers. FIGS. 6A and 6B depict the calculated relationship between the reflectance of $C_1$ mirrors vs. the number of layers remaining on mirrors that initially had 80 total bilayer pairs, i.e., 160 alternating layers of Mo and Si. This represented 40 Mo/Si bilayers for the underlying reflective surface and 40 Mo/Si bilayers for the sacrificial reflective surface. The graphs show the calculated reflectance for the Mo/Si multilayers as the top layers are eroded. In addition, local oscillations which are evident in FIG. 6A are due to the alternating Mo and Si layers. The maximum variation calculated is 1.79% which may be too large to be tolerated at the mask plane, but this can easily be accommodated as an intensity variation at the pupil plane.

Non-uniform multilayer erosion will also create figure changes in the surface of the $C_1$ mirrors. (Figure changes refer to deviations from the ideal prescribed shape of an optic). To first order, the removal of multilayers is not expected to change the phase of the reflected wavefront because the reflection is generated from within the depth of the multilayer stack comprised of materials with near unity refractive index. However, when a large number of mulitlayers are removed the second order effects will result in a measurable phase error in the reflected wavefront. If the multilayer stresses are high, relaxation, due to erosion of top layers, will induce figure changes. One or both of these effects may limit the number of sacrificial multilayers that can be used. Since the figure requirements for the condenser are much looser than those for the imaging optics, this consideration should not be a major constraint.

In the extreme case that the photolithography system is shut down and the $C_1$ mirrors, with the sacrificial reflective surface, has a Mo layer at the top surface, oxidation over an extended period of time will yield a thick layer of $MoO_2$. If the Mo layer is 2.76 nm thick, and assuming a volume increase by 2×, 5.5 nm thick $MoO_2$ can be formed. This phenomenon results in a reflectivity loss of 15.6%. If the all six segment surfaces of the $C_1$ mirrors are at this worse case condition, the loss in reflectivity would be evident as a throughput loss. The oxide layer would be removed with further operation of the source of radiation, so that this oxide component of throughput loss will be temporary. Since the change in throughput is small and slowly varying, it should be easily accommodated in normal tool operation.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A condenser system for use with a camera to collect and image extreme ultra-violet EUV radiation to a mask comprising: a source of radiation that generates EUV radiation; and at least one collector mirror facing the source of radiation wherein the at least one collector mirror comprises a substrate, an underlying reflective surface, and an upper sacrificial reflective surface wherein the underlying reflective surface has a normal incidence reflectivity of at least about 30% of the EUV radiation and wherein the underlying reflective surface comprises a first multilayer film that is deposited on a surface of the substrate and wherein the sacrificial reflective surface is a second multilayer film that is deposited on a surface of the underlying reflective surface and wherein the presence of the upper sacrificial reflective surface does not enhance the reflectance of the at least one collection mirror.

2. The condenser system of claim 1 wherein the at least one collector mirror does not include a passivating overcoat.

3. The condenser system of claim 1 wherein the source of radiation is a laser plasma source.

4. The condenser system of claim 1 wherein (i) the first multilayer film comprises alternating layers of first material having a first refractive index and a second material having a second refractive index that is larger than that of the first material and (ii) the second multilayer film comprises alternating layers of third material having a third refractive index and a fourth material having a fourth refractive index that is larger than that of the third material.

5. The condenser system of claim 4 wherein the first multilayer film comprises about 20 to 80 layer pairs and the second multilayer film comprises about 100 to 400 layer pairs.

6. The condenser system of claim 5 wherein the first multilayer film has a periodicity of about 5 nm to 30 nm and the second multilayer film has a periodicity of about 5 nm to 30 nm.

7. The condenser system of claim 1 wherein the first multilayer film comprises alternating layers of molybdenum and silicon and the second multilayer film comprises alternating layers of molybdenum and silicon.

8. The condenser system of claim 1 wherein the system is for use with a ringfield camera and wherein the at least one collector mirror comprises at least two substantially equal radial segments of a parent aspheric mirror, each having one focus at the radiation source and a curved line focus filling the object field of the camera at the radius of the ringfield and each producing a beam of radiation.

9. The condenser system of claim 8 further comprising: a corresponding number of sets of correcting mirror means which are capable of translation or rotation, or both, such that all of the beams of radiation pass trough the entrance pupil of the camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees, wherein the distance from the collector mirrors to the concave relay mirror is equal to 3 to 10 times the distance from the concave relay minor to the mask.

10. The condenser system of claim 9 wherein the at least one collector mirror comprises six substantially equal radial segments of a parent aspheric mirror.

11. The condenser system of claim 1 wherein the second multilayer film has a thickness that is at least two times that of the first multilayer film.

12. A condenser system having a set of mirrors for collecting extreme ultra-violet (EUV) radiation from a radiation source that forms a source image and having correcting mirrors which are capable of translating or rotating, or both, one or more beams from said set of mirrors and are capable of modifying the convergence of the one or more beams or the size of the source image, or both, and wherein the system includes at least one collector mirror facing a source of EUV radiation wherein the at least one collector minor comprises a substrate, an underlying reflective surface, and an upper sacrificial reflective surface wherein the underlying reflective surface has a normal incidence reflectivity of at least about 30% of the EUV radiation and wherein the underlying reflective surface comprises a first multilayer film that is deposited on a surface of the substrate and wherein the sacrificial reflective surface is a second multilayer film that is deposited on a surface of the underlying reflective surface and wherein the presence of the upper sacrificial reflective surface does not enhance the reflectance of the at least one collection mirror.

13. The condenser system of claim 12 wherein the at least one collector mirror does not include a passivating overcoat.

14. The condenser system of claim 12 wherein the radiation source is a laser plasma source.

15. The condenser system of claim 12 wherein (i) the first multilayer film comprises alternating layers of first material having a first refractive index and a second material having a second refractive index that is larger than that of the first material and (ii) the second multilayer film comprises alternating layers of third material having a third refractive index and a fourth material having a fourth refractive index that is larger than that of the third material.

16. The condenser system of claim 15 wherein the first multilayer film comprises about 20 to 80 layer pairs and the second multilayer film comprises about 100 to 400 layer pairs.

17. The condenser system of claim 16 wherein the first multilayer film has a periodicity of about 5 nm to 30 nm and the second multilayer film has a periodicity of about 5 nm to 30 nm.

18. The condenser system of claim 12 wherein the first multilayer film comprises alternating layers of molybdenum and silicon and the second multilayer film comprises alternating layers of molybdenum and silicon.

19. The condenser system of claim 12 wherein the second multilayer film has a thickness that is at least two times that of the first multilayer film.

* * * * *